US009226071B2

(12) United States Patent
Polleros

(10) Patent No.: US 9,226,071 B2
(45) Date of Patent: Dec. 29, 2015

(54) DIRECT MEASUREMENT OF AN INPUT SIGNAL TO A LOUDSPEAKER TO DETERMINE AND LIMIT A TEMPERATURE OF A VOICE COIL OF THE LOUDSPEAKER

(71) Applicant: Maxim Integrated Products, Inc., San Jose, CA (US)

(72) Inventor: Robert Polleros, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 380 days.

(21) Appl. No.: 13/713,227

(22) Filed: Dec. 13, 2012

(65) Prior Publication Data

US 2014/0169571 A1 Jun. 19, 2014

(51) Int. Cl.

| | |
|---|---|
| ***H03G 11/00*** | (2006.01) |
| ***H04R 3/00*** | (2006.01) |
| ***H04R 9/02*** | (2006.01) |
| ***H04R 29/00*** | (2006.01) |

(52) U.S. Cl.

CPC ................ *H04R 3/007* (2013.01); *H04R 9/022* (2013.01); *H04R 29/003* (2013.01)

(58) Field of Classification Search

None

See application file for complete search history.

(56) References Cited

U.S. PATENT DOCUMENTS

| | | | | |
|---|---|---|---|---|
| 6,628,791 | B1 * | 9/2003 | Bank et al. | 381/113 |
| 6,940,981 | B2 * | 9/2005 | Neunaber | 381/55 |
| 2012/0230514 | A1 * | 9/2012 | Yoneda | 381/96 |

* cited by examiner

*Primary Examiner* — Regina N Holder

(74) *Attorney, Agent, or Firm* — Advent, LLP

(57) ABSTRACT

Aspects of the disclosure pertain to a system and method for providing temperature limiting for a voice coil of a speaker. The system and method provide the aforementioned temperature limiting based upon monitoring (e.g., measurement) of an amplifier output signal provided to the speaker. Providing the aforementioned temperature limiting promotes improved protection for the speaker.

14 Claims, 4 Drawing Sheets

DIRECT MEASUREMENT OF AN INPUT SIGNAL TO A LOUDSPEAKER TO DETERMINE AND LIMIT A TEMPERATURE OF A VOICE COIL OF THE LOUDSPEAKER

BACKGROUND

A speaker can be damaged and/or suffer performance issues when the power of an input signal applied to the speaker exceeds the speaker's power handling capabilities.

SUMMARY

This Summary is provided to introduce a selection of concepts in a simplified form that are further described below in the Detailed Description. This Summary is not intended to identify key and/or essential features of the claimed subject matter. Also, this Summary is not intended to limit the scope of the claimed subject matter in any manner Aspects of the disclosure pertain to a system and method for providing temperature limiting for a voice coil of a speaker. The system and method provide the aforementioned temperature limiting based upon monitoring (e.g., measurement) of an amplifier output signal provided to the speaker. Providing the aforementioned temperature limiting promotes improved protection for the speaker.

BRIEF DESCRIPTION OF THE DRAWINGS

The numerous advantages of the present invention may be better understood by those skilled in the art by reference to the accompanying figures in which.

DETAILED DESCRIPTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will fully convey the scope. Among other things, the features of the disclosure can be facilitated by methods, devices, and/or embodied in articles of commerce. The following detailed description is, therefore, not to be taken in a limiting sense.

Speakers (e.g., loudspeakers) are implemented in numerous devices for producing sound in response to a received electrical audio signal input. For example, a speaker can be configured with a cone which supports a voice coil. The voice coil can be configured as a coil of wire attached to an apex of the loudspeaker cone. Further, the voice coil can be configured for providing motive force to the loudspeaker cone.

A speaker (e.g., a small speaker) can be easily destroyed or damaged when too much power is applied to its voice coil causing the voice coil to become overheated. For example, when the voice coil becomes overheated, the voice coil (e.g., wire) may separate from a diaphragm of the speaker and/or may begin to melt. For speakers implemented in mobile devices, the probability of such damage occurring is elevated due to the proliferation of boosted amplifiers, which are commonly used in such devices.

Currently, a number of solutions are implemented in an effort to limit the temperature (e.g., prevent overheating) of the voice coils of speakers. One solution involves limiting the voltage swing of the amplifier of the speaker. However, some drawbacks associated with limiting amplifier voltage swing are that it doesn't consider actual short-term power handling and it causes amplifier clipping, which has an adverse effect on the sound quality of the speaker. Another solution involves establishing a model of the speaker based on its input voltage which tracks the speaker's condition. However, establishing a speaker model is time-consuming and usually only covers the series of speakers, thereby ignoring individual tolerance. A further problem is the unknown local ambient temperature.

As more fully set forth below, aspects of the disclosure include a system and method for promoting improved speaker performance and protection by directly measuring an input signal to the speaker (e.g., loudspeaker) to determine and control a temperature of a voice coil of the loudspeaker.

Figure 1:
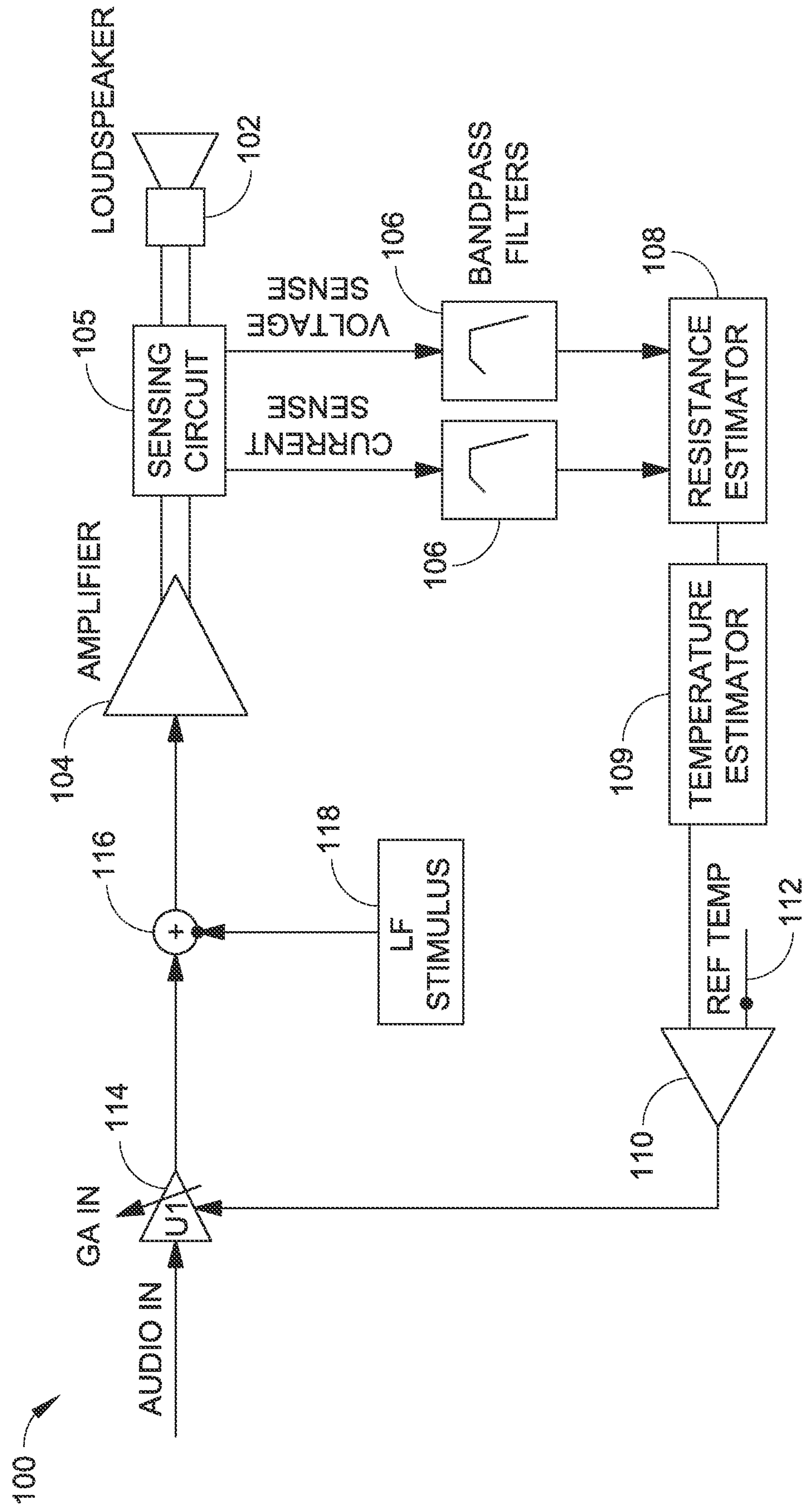
FIG. 1 is an example conceptual block diagram schematic of a speaker system.

As indicated in FIG. 1 (FIG. 1), a system 100 is shown. In embodiments, the system 100 is a speaker system. The speaker system 100 includes a speaker 102. For example, the speaker 102 can be a loudspeaker (e.g., an electrodynamic loudspeaker). The speaker 102 is configured for producing sound in response to a received electrical audio signal input. For instance, the speaker 102 can be configured with a cone which supports a voice coil. The voice coil can be configured as a coil of wire attached to an apex of the cone. Further, the voice coil can be configured for providing motive force to the speaker cone.

System 100 further includes an amplifier 104. The amplifier 104 is connected to the speaker 102. The amplifier 104 (e.g., an electronic amplifier) is configured for increasing the power of (e.g., amplifying) an input signal by using an external energy source. For example, the input signal can be a voltage and/or a current. The amplifier 104 is further configured for transmitting the amplified input signal to the speaker 102 as an amplifier output signal, which includes a voltage and a current. In embodiments, the amplifier 104 is a current and voltage (IV) sense amplifier 104 which is configured for outputting (e.g., providing) both current and voltage information via the amplifier output signal. For example, the amplifier 104 is configured for sensing voltage across the speaker 102 and is further configured for sensing current going into the speaker 102. In an exemplary embodiment, the amplifier 104 can be an 8.5 Volt (8.5 V) boosted amplifier with current and voltage sense.

In embodiments, the amplifier 104 is connected to a sensing circuit 105. In embodiments, the sensing circuit 105 is configured at the output of the amplifier 104 and is configured for measuring the current and voltage of the amplifier output signal (e.g., measuring the current and voltage that is going into the speaker 102). In embodiments, the sensing circuit 105 is configured for transmitting the measured voltage and current to a filter block 106.

In embodiments, the filter block 106, which includes one or more filters, is connected to the sensing circuit 105 and is configured for receiving the measured current and voltage from the sensing circuit 105.

In alternative embodiments, rather than measuring the output voltage provided from the amplifier 104 to the speaker 102, the output voltage may be calculated from the input signal provided to the amplifier 104.

In embodiments, system 100 further includes the one or more filters of the filter block 106. For example, the filters 106 may be low-pass filters and/or bandpass filters which can be configured for allowing passage of low frequency signals and attenuating (e.g., reducing the amplitude of) signals having frequencies which are higher than a pre-determined (e.g., cutoff) frequency. The amount of attenuation for each frequency can vary for individual filters. Because of their above-described attenuation functionality, low-pass filters 106 are configured for extracting a certain frequency band out of the received voltage and current (e.g., the received voltage and current information). In embodiments, the filters 106 are connected to the sensing circuit 105. The filters 106 are configured for receiving the measured current and voltage from the sensing circuit 105. The filter block 106 is configured for producing an output derived from the received current and voltage. The filters 106 are configured for sensing to a same frequency.

System 100 further includes a resistance estimator module 108. For example, the resistance estimator can be a direct current (DC) resistance estimator module 108. The resistance estimator module 108 is connected to the filter block 106. In embodiments, the resistance estimator module 108 can include a processor (e.g., digital signal processor (DSP)) or a codec. The resistance estimator module 108 is configured for receiving the filter block output from the filter block 106, generating (e.g., calculating) a resistance estimate derived from the filter block output, and transmitting (e.g., outputting) the resistance estimate. For example, the resistance estimate output provided by the resistance estimator module 108 may indicate an estimated resistance (e.g., an estimated DC resistance) of the voice coil of the speaker 102 based upon the measured current and voltage of the amplifier output signal being transmitted to the speaker 102. In embodiments, the resistance estimator module 108 determines the estimated resistance by dividing a root mean square (RMS) value of the current and voltage going into the speaker 102 (e.g., the measured current and voltage). In embodiments, a circuit and/or algorithm can be implemented when calculating the resistance estimate (e.g., resistance value). For example, a circuit and/or algorithm can be implemented when calculating a ratio of the measured voltage divided by an amplitude of the measured current.

System 100 further includes a temperature estimator module 109 (e.g., temperature calculation module, temperature conversion module). The temperature estimator module 109 is connected to the resistance estimator module 108 and is configured for receiving the resistance estimate output (e.g., calculated resistance value) from the resistance estimator module 108. In embodiments, the temperature estimator module 108 can include a processor (e.g., digital signal processor (DSP)) or a codec. The temperature estimator module 109 is configured for calculating (e.g., estimating) a temperature of the voice coil of the loudspeaker 102 based upon the resistance estimate output (e.g., calculated resistance value) and transmitting (e.g., outputting) the temperature estimate. The impedance of the loudspeaker 102 varies with frequency, but at very low frequencies or at direct current (DC) there is a direct relationship between resistance and temperature. The temperature coefficient of copper resistance is 0.00393, which means the resistance is rising 0.393% for every degree Celsius (° C.) rise in temperature. Other metals used for voice coils have different but also well-known coefficients. By configuring the filters 106 to pass frequencies at or close to DC, and by having those frequencies available at their amplifier input, one can therefore estimate the voice coil temperature. The temperature can be represented as analog or digital values.

In embodiments, system 100 further includes a comparator 110. For example, the comparator 110 can be a device which compares two voltages or currents and switches its output to indicate which is larger. In digital or software implementations, the comparator 110 compares binary numbers. The comparator 110 is connected to the temperature estimator module 109. The comparator 110 is configured for receiving the calculated temperature estimate transmitted from the temperature estimator module 109. The comparator 110 is further configured for comparing the received temperature estimate to a reference temperature value 112. In embodiments, the reference temperature value can be a pre-determined threshold temperature of the voice coil of the speaker 102 (e.g., a maximum temperature or limit temperature).

In embodiments, predicted resistance at threshold temperature can be determined based upon an underlying assumption that the resistance of the material (e.g., metal) forming the voice coil of the speaker 102 increases with temperature. For example, by knowing: a.) the material (e.g., copper wire) which forms the voice coil of the speaker 102; b.) the resistance of the voice coil material at room temperature; and c.) the temperature coefficient per degree Celsius (e.g., first order approximation) of the voice coil material; the predicted resistance at threshold temperature can be determined. In embodiments, the limit temperature is a temperature for the voice coil of the speaker 102 which, if exceeded, could cause damage to the voice coil of the speaker 102. For example, the limit temperature for the voice coil of the speaker 102 can be equal to or approximately equal to 120° Celsius.

In embodiments, the comparator 110 is further configured for generating and transmitting an output based upon the comparison between the received temperature estimate and the reference temperature value. For example, the comparison may determine (e.g., indicate) that the received resistance estimate equals, exceeds or is close to a reference resistance value of the voice coil, thereby indicating that the temperature of the voice coil is equal to, exceeds, or is close to the threshold temperature of the voice coil, which, in turn, indicates that the amplifier output signal being transmitted to the speaker 102 is causing or could cause damage the speaker 102. Alternatively, the comparison may determine that the received resistance estimate (and thus the temperature) of the voice coil of the speaker 102 are well below the reference resistance value and threshold temperature of the voice coil, thereby indicating that the amplifier output signal being transmitted to the speaker 102 is not or will not damage the speaker 102. In embodiments, a circuit and/or algorithm can be implemented when comparing the calculated resistance estimate to the reference resistance value (e.g., limit value) and when generating the comparator output based upon the comparison.

System 100 further includes an audio gain circuit 114. The audio gain circuit 114 is connected to the comparator 110. Further, the audio gain circuit 114 is configured for receiving the output transmitted from the comparator 110. The audio gain circuit 114 is further configured for receiving an audio input (e.g., audio input signal (Audio In)). Further, the audio gain circuit 114 is configured for attenuating the audio input signal. For example, the audio gain circuit 114 is configured for adjusting (e.g., decreasing, increasing) an amount of gain applied to the audio input signal based upon the received comparator output. For example, when the comparison by the comparator 110 determines that the temperature estimate equals, exceeds or is close to a reference temperature value of the voice coil (and thus, that the resistance estimate equals, exceeds or is close to a reference resistance value of the voice coil), the comparator output can provide an indication that this is the case and may cause (e.g., may include instructions for causing) the audio gain circuit 114 to reduce the amount of gain applied to the audio input signal. The audio gain circuit 114 is further configured for transmitting an audio gain circuit output derived from the received comparator output and the audio input signal. When the gain applied to the audio input signal is reduced, this results in a reduced power amplifier output signal being applied the speaker 102 for bringing and/or maintaining the resistance and temperature of the voice coil of the speaker within the desired thresholds discussed above for protecting the speaker 102. The system 100 thus operates as a control loop which monitors and adjusts an amount of gain applied to an audio input signal for controlling a resistance and temperature of a voice coil of the speaker 102.

In embodiments, system 100 further includes a summer 116. For instance, the summer (e.g., adder) can be a digital circuit configured for adding (e.g., summing signals). The summer 116 is connected to the audio gain circuit 114. The summer 116 is configured for receiving the output transmitted by the audio gain circuit 114. Further, the summer is connected to a low frequency (LF) stimulus source 118. The summer 116 is configured for receiving a low frequency (LF) stimulus signal transmitted by the low frequency (LF) stimulus source 118. The LF stimulus signal includes a current component and a voltage component. In embodiments, the LF stimulus signal can be Direct Current (DC) (e.g., 0 Hertz (Hz)) or Alternating Current (AC) (e.g., a 16 Hertz (Hz). In embodiments, the bandpass filters 106 are tuned to the frequency range of the LF stimulus signal (e.g., the frequency of the LF stimulus signal matches a passband of the filters). In embodiments in which the LF stimulus signal is 0 Hz, a bandpass filter 106 tuned to 0 Hz is a lowpass filter 106. Further, the summer 116 is configured for adding the received LF stimulus signal to the received audio gain circuit output and transmitting an output to the amplifier 104. The output transmitted from the summer 116 is derived from the LF stimulus signal and the audio gain circuit output. Further, the amplifier 104 is configured for receiving the output transmitted from the summer 116. The amplifier 104 is configured for providing the amplifier output (e.g., the reduced power amplifier output) to the speaker 102 the amplifier output being derived from the received output transmitted from the summer 116.

In embodiments, the system 100 includes processing functionality, provided via a processor (e.g., digital signal processor (DSP)) or a codec. The processing functionality can be implemented within one or more of the components of the system 100, such as within the resistance estimator module 108 and the temperature estimator module 109, as mentioned above. The processing functionality is configured for processing the amplifier input signal, as well as current and voltage information of the amplifier output in real time.

The system 100 described above uses direct measurement of the amplifier output signal fed to the voice coil of the speaker 102 to determine and control a resistance and a temperature of the voice coil of the speaker 102 in a manner which: a.) does not rely upon a models (e.g., model parameters) or history of signals; and b.) can drive the speaker 102 safely to its maximum loudness.

The system 100 described above can be implemented in a number of devices, such as cell phones (e.g., smartphones), tablet computers, notebook computers (e.g., laptops), e-books and accessories (e.g., docking stations).

The above-described functionality of the system 100 works in parallel with and transparent to normal audio playback of the system 100 and delivers true results (e.g., results which are independent of audio content and ambient temperature). Algorithms (e.g., power limiting algorithms) implemented by the system 100 for providing such functionality promote fundamental technological improvement in speaker protection.

Figure 2A:
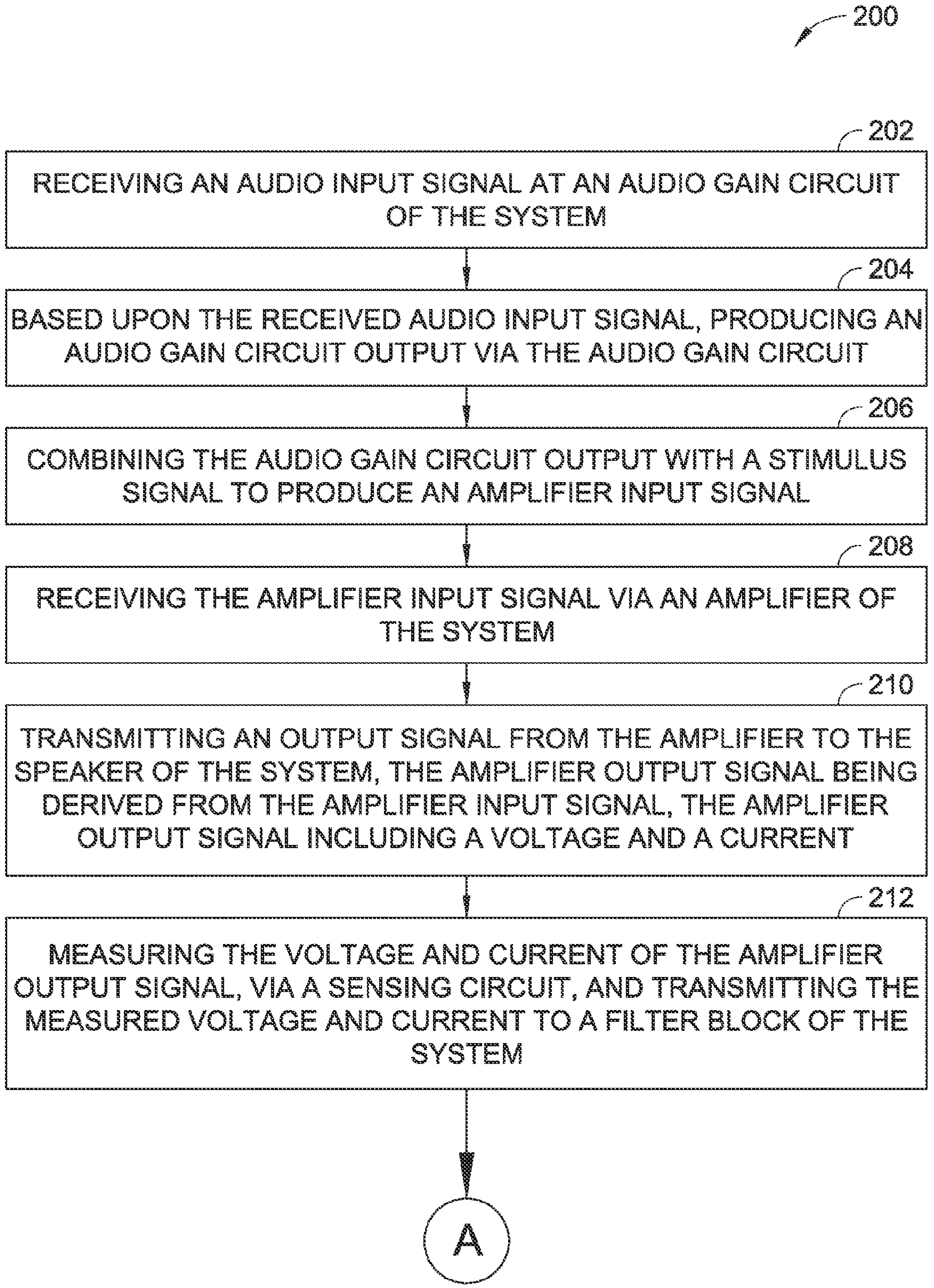
FIGS. 2A and 2B depict a flow chart illustrating a method for providing temperature limiting for a voice coil of a speaker of a speaker system.
Figure 2B:
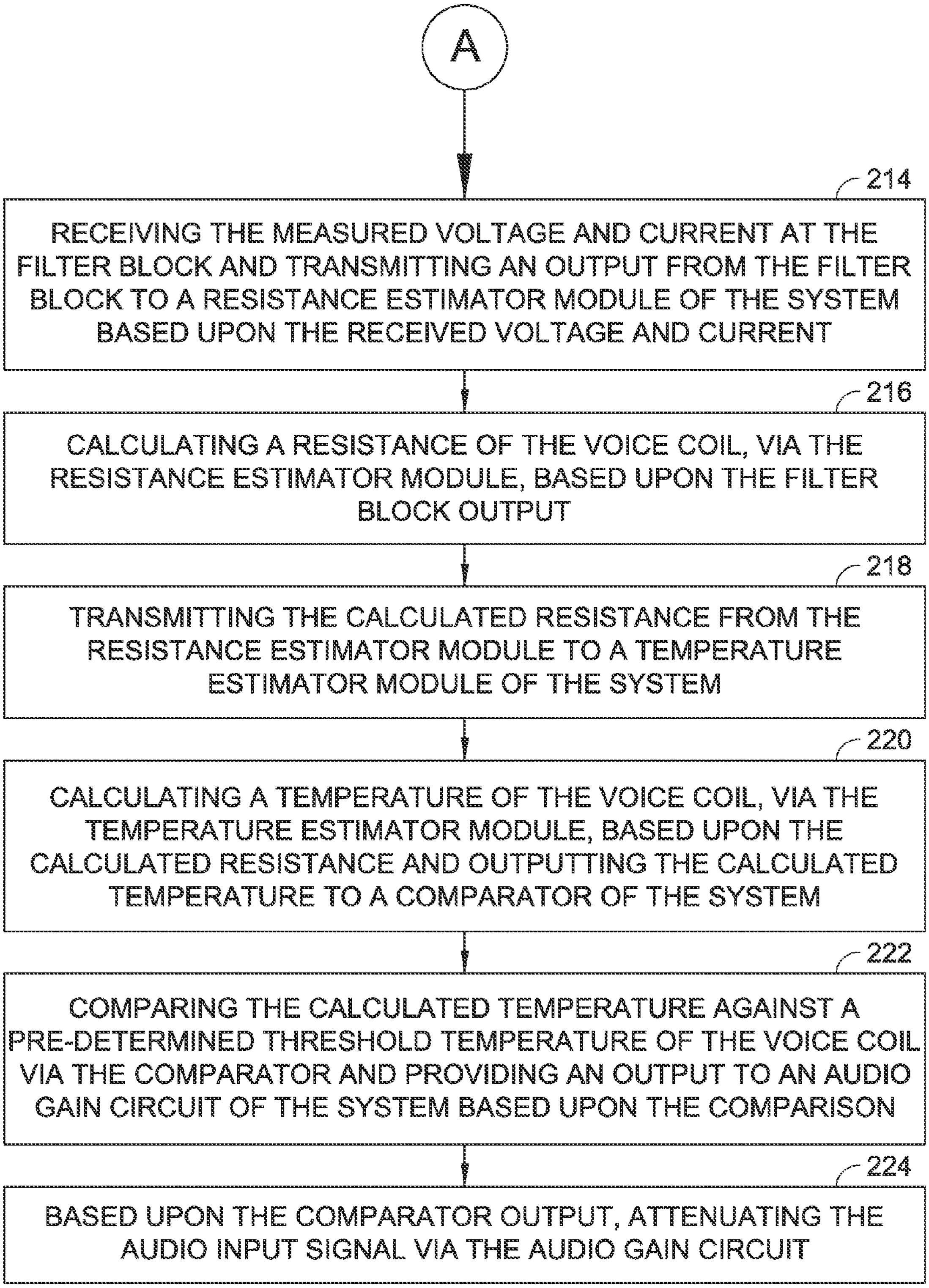
Figure 3:
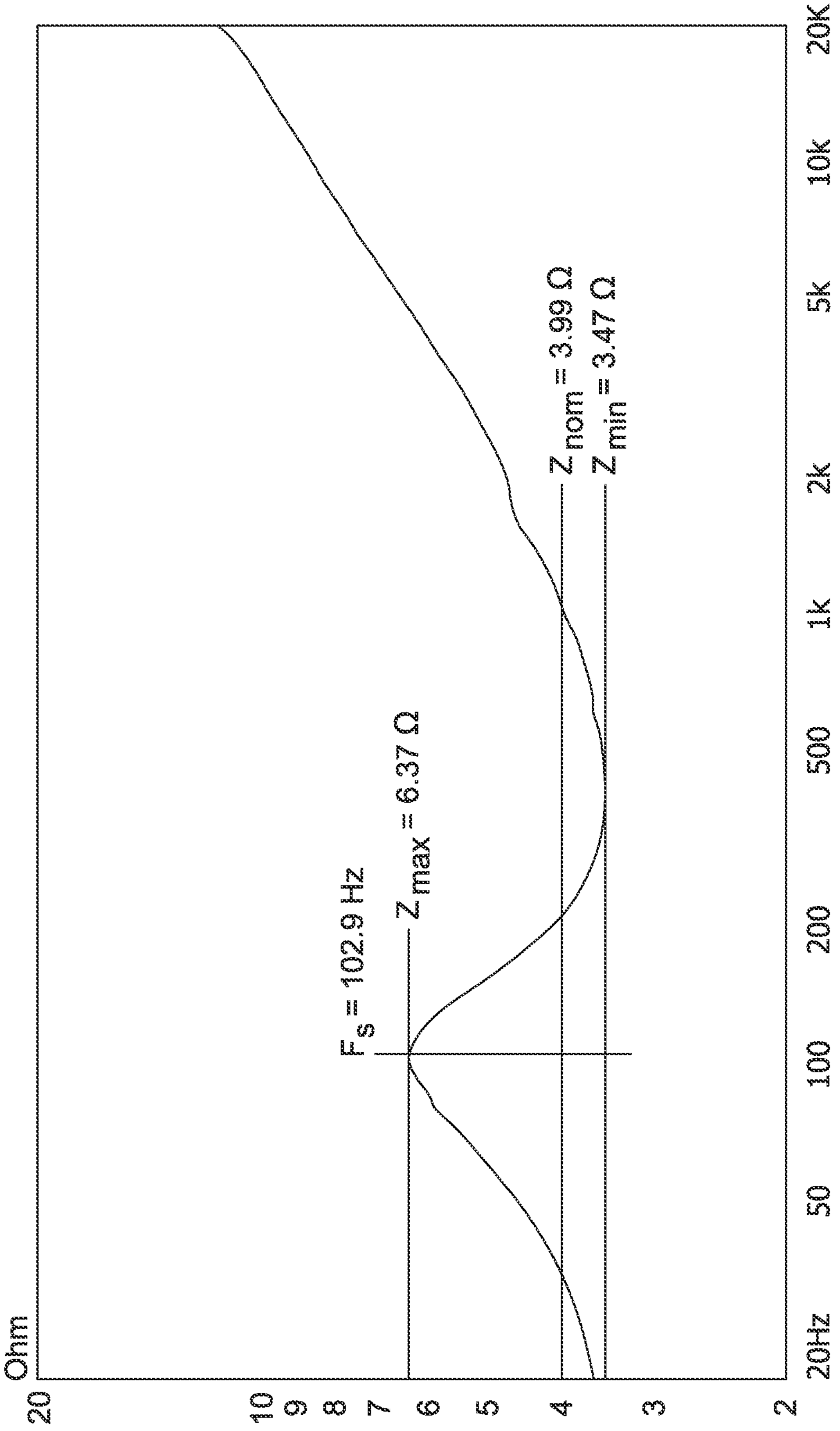
FIG. 3 is an exemplary graphical depiction of impedance-versus-frequency for a voice coil of a speaker system.

FIGS. 2A and 2B (FIGS. 2A and 2B) depict a flowchart illustrating a method for providing temperature limiting for a voice coil of a speaker of a speaker system. The method 200 includes the step of receiving an audio input signal at an audio gain circuit of the system 202. The method 200 further includes the step of transmitting an audio gain circuit output based upon the audio input signal 204. The method 200 further includes the step of combining the audio gain circuit output with a stimulus signal to produce an amplifier input signal 206. In embodiments, the stimulus signal is a low frequency (LF) signal. For example, the stimulus signal can be a LF Alternating Current (AC) signal, such as a 16 Hertz (Hz) sinewave or band limited noise, which is applied to the speaker 102. For instance, based upon an underlying assumption that the impedance of the voice coil of the speaker 102 rises around resonant frequency, but is very close to its DC value at low frequencies, the low frequency AC signal is applied to the speaker 102 to avoid offset errors. This is illustrated by FIG. 3, which is a graph depicting an exemplary impedance (Z) versus frequency (F) curve for the voice coil of the speaker 102. In FIG. 3, impedance (Z) is shown measured in ohms, while frequency (F) is shown measured in hertz. Further, in FIG. 3, the resonant frequency, ($F_s$), is depicted, and the maximum impedance ($Z_{max}$), minimum impedance ($Z_{min}$), and nominal impedance ($Z_{nom}$) are also shown. In embodiments, the method 200 further includes the step of receiving the amplifier input signal via an amplifier of the system 208.

The method 200 further includes the step of transmitting an output signal from the amplifier to the speaker of the system, the amplifier output signal being derived from the amplifier input signal, the amplifier output signal including a voltage and a current 210. The method 200 further includes the step of measuring the voltage and current of the amplifier output signal via a sensing circuit and transmitting the measured voltage and current to a filter block of the system 212. The method 200 further includes the step of receiving the measured voltage and current and transmitting an output from the filter block to a resistance estimator module of the system based upon the received voltage and current 214. The method 200 further includes the step of calculating a resistance of the voice coil via the resistance estimator module based upon the filter block output 216.

In embodiments, the method 200 further includes the step of transmitting the calculated resistance from the resistance estimator module to a temperature estimator module of the system 218. In embodiments, the method 200 further includes the step of calculating a temperature of the voice coil, via the temperature estimator module, based upon the calculated resistance and outputting the calculated temperature to a comparator of the system 220. In embodiments, the method 200 further includes the step of comparing the calculated temperature against a pre-determined threshold temperature of the voice coil via the comparator and providing an output to an audio gain circuit of the system based upon the comparison 222. The method 200 further includes the step of, based upon the comparator output, attenuating the audio input signal via the audio gain circuit 224.

In embodiments, component(s) of the system 100 and/or step(s) of the method 200 described above can be implemented in hardware (e.g., a chip) and/or software.

In further embodiments, the above-described system functionality and method can be expanded to not only derive the temperature of the speaker 102, but to also derive a complete characterization of the speaker 102, including resonant frequency and Q (quality factor), in the absence of an audio signal. Algorithm(s) may be implemented for providing such derivations.

It is to be noted that the foregoing described embodiments may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the embodiments described herein may be conveniently implemented in forms of a software package. Such a software package may be a computer program product which employs a non-transitory computer-readable storage medium including stored computer code which is used to program a computer to perform the disclosed functions and processes disclosed herein. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system for providing temperature limiting for a voice coil of a speaker, comprising:

an amplifier connected to the speaker, the amplifier configured for receiving an amplifier input signal, generating an amplifier output signal based upon the amplifier input signal and transmitting the amplifier output signal to the speaker;

a sensing circuit connected to the amplifier, the sensing circuit configured for measuring a voltage and a current of the amplifier output signal and providing an output signal including the measured voltage and measured current;

a filter block connected to the sensing circuit, the filter block configured for receiving the sensing circuit output signal, and based upon the sensing circuit output signal, providing an output signal including the measured voltage and measured current; and a resistance estimator module including a processor, the resistance estimator module being connected to the filter block, the resistance estimator module configured for receiving the measured current and measured voltage from the filter block, calculating an estimated resistance of the voice coil based upon the measured voltage and the measured current by dividing a root mean square value of the measured voltage and the measured current, and providing an output including the estimated resistance; and a temperature estimator module connected to the resistance estimator module, the temperature estimator module being configured for receiving the resistance estimator module output and calculating a temperature of the voice coil based upon the estimated resistance, wherein the amplifier input signal is attenuated based upon a comparison of the calculated temperature of the voice coil against a pre-determined threshold temperature of the voice coil.

2. The system as claimed in claim 1, wherein the sensing circuit is configured for sensing voltage across the speaker and current going into the speaker.

3. The system as claimed in claim 1, further comprising:

a comparator, the comparator being connected to the temperature estimator module, the comparator configured for comparing the calculated temperature against the pre-determined threshold temperature, the comparator configured for providing an output based upon the comparison.

4. The system as claimed in claim 3, further comprising:

an audio gain circuit, the audio gain circuit being connected to the comparator, the audio gain circuit configured for receiving the comparator output, the audio gain circuit configured for receiving an audio input signal, the audio gain circuit configured for attenuating the audio input signal based upon the comparator output to provide an audio gain circuit output.

5. The system as claimed in claim 4, further comprising:

a signal summer, the signal summer being connected to the audio gain circuit, the signal summer configured for receiving the audio gain circuit output, the signal summer configured for receiving a stimulus signal from a stimulus source, the signal summer configured for combining the audio gain circuit output with the stimulus signal to produce the amplifier input signal.

6. The system as claimed in claim 5, wherein the stimulus signal is a subsonic signal.

7. A method for providing temperature limiting for a voice coil of a speaker of a speaker system, comprising:

receiving an audio input signal at an audio gain circuit of the system;

based upon the received audio input signal, producing an audio gain circuit output via the audio gain circuit;

combining the audio gain circuit output with a stimulus signal to produce an amplifier input signal;

receiving the amplifier input signal via an amplifier of the system;

transmitting an output signal from the amplifier to the speaker of the system, the amplifier output signal being derived from the amplifier input signal, the amplifier output signal including a voltage and a current;

measuring the voltage and current of the amplifier output signal, via a sensing circuit, and transmitting the measured voltage and current to a filter block of the system;

receiving the measured voltage and current at the filter block and transmitting an output from the filter block to a resistance estimator module of the system based upon the received voltage and current; and calculating an estimated resistance of the voice coil, via the resistance estimator module, based upon the filter block output, by dividing a root mean square value of the measured voltage and the measured current.

8. The method for providing temperature limiting as claimed in claim 7, further comprising:

transmitting the estimated resistance from the resistance estimator module to a temperature estimator module of the system.

9. The method for providing temperature limiting as claimed in claim 8, further comprising:

calculating a temperature of the voice coil, via the temperature estimator module, based upon the estimated resistance and outputting the calculated temperature to a comparator of the system.

10. The method for providing temperature limiting as claimed in claim 9, further comprising:

comparing the calculated temperature against a pre-determined threshold temperature of the voice coil via the comparator and providing an output to an audio gain circuit of the system based upon the comparison.

11. The method for providing temperature limiting as claimed in claim 10, further comprising:

based upon the comparator output, attenuating the audio input signal via the audio gain circuit.

12. A non-transitory computer-readable medium having computer-executable instructions for performing a method for providing temperature limiting for a voice coil of a speaker of a speaker system, the method comprising:

receiving an audio input signal at an audio gain circuit of the system;

based upon the received audio input signal, producing an audio gain circuit output via the audio gain circuit;

combining the audio gain circuit output with a stimulus signal to produce an amplifier input signal;

receiving the amplifier input signal via an amplifier of the system;

transmitting an output signal from the amplifier to the speaker of the system, the amplifier output signal being derived from the amplifier input signal, the amplifier output signal including a voltage and a current;

measuring the voltage and current of the amplifier output signal, via a sensing circuit, and transmitting the measured voltage and current to a filter block of the system;

receiving the measured voltage and current at the filter block and transmitting an output from the filter block to a resistance estimator module of the system based upon the received voltage and current;

calculating an estimated resistance of the voice coil, via the resistance estimator module, by dividing a root mean square value of the measured current and the measured voltage; and transmitting the calculated resistance from the resistance estimator module to a temperature estimator module of the system.

13. The non-transitory computer-readable medium as claimed in claim 12, the method further comprising:

calculating a temperature of the voice coil, via the temperature estimator module, based upon the estimated resistance and outputting the calculated temperature to a comparator of the system; and comparing the calculated temperature against a pre-determined threshold temperature of the voice coil via the comparator and providing an output to an audio gain circuit of the system based upon the comparison.

14. The non-transitory computer-readable medium as claimed in claim 13, the method further comprising: based upon the comparator output, attenuating the audio input signal via the audio gain circuit.

* * * * *